(12) United States Patent
Toyoda

(10) Patent No.: US 9,502,496 B2
(45) Date of Patent: Nov. 22, 2016

(54) SEMICONDUCTOR DEVICE AND METHOD OF MANUFACTURING THE SAME

(71) Applicant: FUJI ELECTRIC CO., LTD., Kawasaki-shi (JP)

(72) Inventor: Yoshiaki Toyoda, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/919,084

(22) Filed: Oct. 21, 2015

(65) Prior Publication Data

US 2016/0043166 A1 Feb. 11, 2016

Related U.S. Application Data

(62) Division of application No. 13/980,046, filed as application No. PCT/JP2012/056777 on Mar. 15, 2012, now Pat. No. 9,209,296.

(30) Foreign Application Priority Data

Mar. 17, 2011 (JP) .................................. 2011-058897

(51) Int. Cl.
*H01L 29/06* (2006.01)
*H01L 29/78* (2006.01)
(Continued)

(52) U.S. Cl.
CPC ... *H01L 29/0615* (2013.01); *H01L 21/823412* (2013.01); *H01L 21/823418* (2013.01);
(Continued)

(58) Field of Classification Search
CPC .............. H01L 21/823412; H01L 21/823418; H01L 21/823456; H01L 21/823487; H01L 27/088; H01L 29/06; H01L 29/66; H01L 29/78; H01L 29/423; H01L 29/0615; H01L 29/1095; H01L 29/4236; H01L 29/66666; H01L 29/7397; H01L 29/7803; H01L 29/7811; H01L 29/7813; H01L 29/7827; H01L 21/28273; H01L 27/115; H01L 27/11521; H01L 29/66621; H01L 29/66734; H01L 29/42368; H01L 29/0696
USPC ................ 438/270, 209, 212, 259, 271, 589
See application file for complete search history.

(56) References Cited

U.S. PATENT DOCUMENTS 5,550,067 A 8/1996 Kuroyanagi et al.
6,118,150 A 9/2000 Takahashi
(Continued)

FOREIGN PATENT DOCUMENTS

CN 1650437 A 8/2005
CN 101931003 A 12/2010
(Continued)

OTHER PUBLICATIONS

Chinese Office Action with translation dated May 29, 2015.

*Primary Examiner* — Chuong A Luu
(74) *Attorney, Agent, or Firm* — Rabin & Berdo, P.C.

(57) ABSTRACT

A semiconductor device includes a vertical trench gate element portion and a lateral n-channel element portion for control which includes a well diffusion region, and a junction edge termination region which surrounds the vertical trench gate element portion and the lateral n-channel element portion for control. The junction edge termination region includes an oxide layer, a sustain region in contact with a trench provided at the end, and a diffusion region in contact with the sustain region. The diffusion region is deeper than the base region and has low concentration. The sustain region is shallower than the diffusion region and has high concentration. The well diffusion region is deeper than the base region and the sustain region and has low concentration. The breakdown voltage of the junction edge termination region and the well diffusion region is higher than that of the vertical trench gate element portion.

2 Claims, 9 Drawing Sheets

(51) Int. Cl.
*H01L 21/8234* (2006.01)
*H01L 27/088* (2006.01)
*H01L 29/10* (2006.01)
*H01L 29/739* (2006.01)
*H01L 29/423* (2006.01)
*H01L 29/66* (2006.01)
*H01L 29/40* (2006.01)

(52) U.S. Cl.
CPC ............ *H01L21/823456* (2013.01); *H01L 21/823487* (2013.01); *H01L 27/088* (2013.01); *H01L 29/1095* (2013.01); *H01L 29/4236* (2013.01); *H01L 29/66666* (2013.01); *H01L 29/7397* (2013.01); *H01L 29/7803* (2013.01); *H01L 29/7811* (2013.01); *H01L 29/7813* (2013.01); *H01L 29/7827* (2013.01); *H01L 29/0696* (2013.01); *H01L 29/402* (2013.01)

(56) References Cited

U.S. PATENT DOCUMENTS

| | | | |
|---|---|---|---|
| 6,323,518 | B1 | 11/2001 | Sakamoto et al. |
| 9,293,460 | B2 * | 3/2016 | Edwards ............ H01L 27/0262 |
| 2002/0100935 | A1 | 8/2002 | Inoue |
| 2003/0080355 | A1 | 5/2003 | Shirai et al. |
| 2003/0205758 | A1 | 11/2003 | Zeng |
| 2008/0142799 | A1 * | 6/2008 | Kaneko ............ H01L 27/0629 257/49 |
| 2009/0111230 | A1 | 4/2009 | Nishimura |

FOREIGN PATENT DOCUMENTS

| | | |
|---|---|---|
| EP | 0 801 425 A1 | 10/1997 |
| JP | H05-283628 | 10/1993 |
| JP | H06-151728 | 5/1994 |
| JP | H10-056174 | 2/1998 |
| JP | 2000-022140 A | 1/2000 |
| JP | 2000-091344 A | 3/2000 |
| JP | 2002-222952 A | 8/2002 |
| JP | 2003-133557 A | 5/2003 |
| JP | 3410286 B2 | 5/2003 |
| JP | 2003-264289 A | 9/2003 |
| JP | 2008-103529 A | 5/2008 |
| JP | 2008-124511 A | 5/2008 |
| JP | 2008-227239 A | 9/2008 |
| JP | 2009-105268 A | 5/2009 |
| WO | WO-2006/082617 A1 | 8/2006 |

* cited by examiner

SEMICONDUCTOR DEVICE AND METHOD OF MANUFACTURING THE SAME

CROSS-REFERENCE TO RELATED APPLICATION

This is a Divisional of U.S. application Ser. No. 13/980,046, filed on Sep. 30, 2013, now U.S. Pat. No. 9,209,296 and allowed on Sep. 4, 2015, which was a National Stage application of PCT/JP2012/056777 filed on Mar. 15, 2012, and claims the benefit of foreign priority of Japanese Patent Application No. 2011-058897, filed on Mar. 17, 2011. The disclosures of these prior applications are incorporated herein by reference.

FIELD

The present invention relates to a semiconductor device which is called a complex semiconductor device, such as a trench gate-type power IC which has a high breakdown voltage, in which a vertical trench MOS gate-type semiconductor element and a semiconductor element for protection or control are formed on the same semiconductor substrate, and a method of manufacturing the same.

BACKGROUND

A vertical trench MOS gate-type semiconductor element has been proposed in which a gate region is provided in a trench in order to reduce the on resistance of a MOS-type semiconductor element with a small area. FIG. 3 is a cross-sectional view illustrating a main portion of a general vertical trench gate MOS-type semiconductor element and a junction edge termination region thereof. In the semiconductor element illustrated in FIG. 3, the breakdown voltage of a junction edge termination region 69 needs to be higher than that of an active region 68 such that a current caused by avalanche breakdown flows to the active region 68.

Therefore, a p$^-$ diffusion region 54 with a concentration lower than that of a p-type base region 55 is provided in the junction edge termination region 69. In this way, a depletion layer is likely to be extended from the active region 68 to the junction edge termination region 69 when an off voltage is applied. Therefore, the maximum field intensity of the junction edge termination region 69 is sufficiently reduced and the breakdown voltage of the junction edge termination region 69 increases. As a result, the overall breakdown voltage of the trench gate MOS-type semiconductor element is determined by the p-type base region junction or breakdown due to the concentration of the electric field on the bottom of the trench gate.

Further, a complex semiconductor device which is called an insulated gate semiconductor device with a protection function in which the lateral semiconductor element for protection illustrated in the cross-sectional view of FIG. 2 is formed on the same semiconductor substrate has been proposed in order to improve the breakdown voltage reliability or breakdown resistance of the trench gate MOS-type semiconductor element illustrated in FIG. 3 serving as an output-stage element at a low cost (Patent Literature 1).

FIG. 2 is a cross-sectional view illustrating a general lateral planar MOS-type semiconductor element for control. The protective semiconductor element illustrated in FIG. 2 includes a lateral n-channel MOSFET which is provided in a p well diffusion region 35 partitioned by a well junction 40.

In a complex semiconductor device of the semiconductor elements illustrated in FIGS. 2 and 3, a common semiconductor substrate including an n$^+$ substrate (corresponding to reference numeral 32 in FIG. 2 and reference numeral 52 in FIG. 3) and an n$^-$ epitaxial layer (corresponding to reference numeral 33 in FIG. 2 and reference numeral 53 in FIG. 3) provided on the n$^+$ substrate includes active regions (corresponding to reference numeral 48 in FIG. 2 and reference numeral 68 in FIG. 3) of a protective lateral semiconductor element and a vertical MOSFET (MOS field effect transistor) and junction edge termination regions (corresponding to reference numeral 49 in FIG. 2 and reference numeral 69 in FIG. 3) which surround the active regions.

In the complex semiconductor device, the off voltage applied to the vertical MOSFET, which is an output-stage element, is applied to the output-stage element and the well junction 40 of the protective semiconductor element illustrated in FIG. 2 at the same time. Therefore, both the active region 68 of the vertical MOSFET illustrated in FIG. 3 and the well junction 40 (that is, the pn junction between the p$^-$ well diffusion region 35 and the n$^-$ epitaxial layer 33) of the protective semiconductor element illustrated in FIG. 2 need to have an effective breakdown voltage for the off voltage.

In the protective semiconductor element illustrated in FIG. 2, the lateral n-channel MOSFET is formed in the well diffusion region partitioned by the well junction 40. The breakdown voltage of the well junction 40 is, for example, 50 V. Further, in the following description, for convenience, a breakdown voltage of 50 V or less is referred to as a low breakdown voltage and a breakdown voltage higher than 50 V is referred to as a high breakdown voltage.

The active region 48 of the protective semiconductor element illustrated in FIG. 2 includes a gate oxide layer 37, a gate electrode 36, a drain region 38a, a source region 38b, a p-type base region and a base contact region 39 which form a portion of a p$^-$ well diffusion region 35, and a drain electrode 12, a source electrode 13, and a base electrode 14 which come into contact with the surface of each region. In addition, the junction edge termination region 49 includes a LOCOS oxide layer 41 in order to prevent a reduction in the breakdown voltage of the well junction 40.

On the other hand, the vertical trench MOS gate-type semiconductor element portion illustrated in FIG. 3 includes a source electrode 65 that is connected to an n$^+$ source region 58, a p-type base region 55, and a p$^+$ contact region 60 provided above the main surface of the semiconductor substrate and a drain electrode 51 that comes into contact with the n$^+$ substrate 52 in the drain region on the rear side. The gate electrode 56 is formed by filling polysilicon in the trench with a gate oxide layer 57 interposed therebetween and is connected to a gate electrode pad on the surface of the substrate by a gate electrode line (not illustrated). A structure including, for example, the p-type base region 55, the gate electrode 56, the gate oxide layer 57, the n$^+$ source region 58, and the p$^+$ contact region 60 with high impurity concentration as described above is referred to as a trench MOS gate structure.

The junction edge termination region 69 surrounding the active region 68 includes a LOCOS oxide layer 61 and a p$^-$ diffusion region 54 having an electric field reducing function and is provided such that the breakdown voltage thereof is higher than that of the main junction between the p-type base region 55 and the n$^-$ epitaxial layer 53. In the junction edge termination region 69, since the junction is not flat, the maximum field intensity generated by the application of the off voltage is likely to be concentrated on a narrow region and an element breakdown is likely to occur. Therefore, the p$^-$ diffusion region 54 with an electric field reducing function is needed in order to prevent the concentration of the current due to a reduction in the breakdown voltage.

In the vertical trench gate MOSFET element illustrated in FIG. 3, the trench gate structure makes it possible to improve channel density and reduce the off resistance, as compared to the planar gate MOSFET. Therefore, the trench gate structure is applied to a power IC which includes the vertical MOSFET and has a rated voltage of about 50 V to 100 V or a high breakdown voltage glass higher than the rated voltage.

As such, when the breakdown voltage is increased to 50 V or more, the electric field is not sufficiently reduced in the depletion layer which is extended when the off voltage is applied, in the junction edge termination region including only the LOCOS oxide layer 61 and the breakdown voltage is likely to be reduced in the junction edge termination region. Therefore, the $p^-$ diffusion region 54 described above is provided in addition to the LOCOS oxide layer 61, which makes it possible to reduce the electric field and prevent a reduction in the breakdown voltage.

FIG. 5 is a cross-sectional view illustrating a main portion of the vertical trench gate MOS-type semiconductor element according to the related art and the junction edge termination region thereof. FIG. 5 illustrates a preferred example for the vertical trench gate MOS-type semiconductor element with a high breakdown voltage. As illustrated in FIG. 5, an element has been proposed which does not include the above-mentioned protective semiconductor element and includes an active region 68 having a vertical trench gate MOS structure and a junction edge termination region 69 which is arranged so as to surround the outer circumference of the active region 68 and includes a $p^-$ RESURF (Reduced surface electric field) region 70 for reducing the electric field (for example, see the following Patent Literature 2). A field plate 56c may be formed on an oxide layer 61 and the RESURF region 70.

In a complex semiconductor device, such as a trench gate-type power IC formed by integrating the protective semiconductor element with the vertical trench gate MOS-type semiconductor element, for the same reason as described above, the junction edge termination region 69 needs to be configured such that the breakdown voltage thereof is higher than a main junction breakdown voltage in order to reduce the off resistance of the vertical trench gate MOS-type semiconductor element and prevent a reduction in the breakdown voltage. In order to meet the requirements, it is effective to add an electric field reducing mechanism, such as a polysilicon film field plate 67 or a metal film field plate 66, to the junction edge termination region 69, in addition to the same region as the $p^-$ diffusion region 54 illustrated in FIG. 3. In addition, in Patent Literature 2 relating to the above-mentioned trench gate-type power IC, a region corresponding to the $p^-$ RESURF region 70 which is provided in order to reduce the electric field in the junction edge termination region is a region having the known RESURF effect, that is, a region having the effect of reducing field intensity by sufficiently depleting substantially the entire $p^-$ RESURF region 70 such that the surface thereof is not fully depleted.

CITATION LIST

Patent Literature

Patent Literature 1: JP 2003-264289 A (paragraph 0002)
Patent Literature 2: JP 2009-105268 A (FIG. 2)

However, it is necessary to add a process for forming the $p^-$ RESURF region 70 with low impurity concentration, in order to apply the $p^-$ RESURF region 70 with low impurity concentration which satisfies the conditions of the RESURF effect to a complex semiconductor device, such as a trench gate-type power IC, without any change. In this case, the process costs are added, which results in an increase in costs.

When the $p^-$ RESURF region 70 with low impurity concentration which satisfies the conditions of the RESURF effect is used in the termination breakdown voltage structure, the field intensity distribution is likely to vary over time due to the influence of external charge in the vicinity of the end of the junction close to the surface of the substrate. As a result, the reliability of the breakdown voltage is reduced.

SUMMARY

The invention has been made in view of the above-mentioned problems and an object of the invention is to provide a semiconductor device which can reduce on resistance and improve the reliability of the breakdown voltage and breakdown resistance, without adding a new manufacturing process, and can be manufactured at a low cost without an increase in costs and a method of manufacturing the same.

In order to solve the problems and achieve the object, a semiconductor device according to the invention includes: a main drain region which is a first conduction type and is formed on a first main surface of a semiconductor substrate of a first conduction type; a vertical trench MOS gate-type semiconductor element portion including a base region that is a second conduction type and is selectively formed on a second main surface of the semiconductor substrate, a main source region that is the first conduction type and is selectively formed on a surface of the base region, a trench that extends from the surface of the base region to the semiconductor substrate through the base region and the main source region, and a trench MOS gate that includes a gate electrode provided in the trench with a first insulating film, which is an insulating film, interposed therebetween; a semiconductor element portion for control that is adjacent to the vertical trench MOS gate-type semiconductor element portion, with an element isolation region including a second insulating film which is formed on the second main surface of the semiconductor substrate and is thicker than the first insulating film interposed therebetween, includes a well diffusion region which is the second conduction type and forms a pn junction with the semiconductor substrate on the second main surface of the semiconductor substrate, a gate electrode for control which is formed on a surface of the well diffusion region with a third insulating film which is thinner than the second insulating film interposed therebetween, and a control drain region of the first conduction type and a control source region of the first conduction type which are provided on the surface of the well diffusion region with the control gate electrode interposed between, and controls the vertical trench MOS gate-type semiconductor element portion; and a junction edge termination region that includes the second insulating film provided on the second main surface of the semiconductor substrate and surrounds the vertical trench MOS gate-type semiconductor element portion or both the vertical trench MOS gate-type semiconductor element portion and the semiconductor element portion for control. The junction edge termination region includes the second insulating film, a sustain region which is the second conduction type and comes into contact with the trench at the end of the vertical trench MOS gate-type semiconductor element portion, and a first region which is the second conduction type and is provided so as to come into contact with the outside of the sustain region. The first region has a junction depth greater than that of the base region and has low impurity concentration. The sustain region has a junction depth less than that of the first region and has high impurity concentration. The well diffusion region has a junction depth greater than those of the base region and the sustain region and has low impurity concentration. An avalanche breakdown voltage of the junction edge termination region and the well diffusion region is higher than that of the vertical trench MOS gate-type semiconductor element portion.

Further, in the semiconductor device according to the invention, the junction edge termination region may include a field plate that is provided on the second insulating film. In the semiconductor device according to the invention, the vertical trench MOS gate-type semiconductor element may be an IGBT including a collector layer that is a second conduction type and comes into contact with the main drain region on the side of the first main surface.

A method of manufacturing the semiconductor device according to the invention includes forming the first region and the well diffusion region included in the semiconductor device at the same time. In the method of manufacturing the semiconductor device according to the invention, the sustain region and the base region included in the semiconductor device may be formed at the same time.

Advantageous Effects of Invention

According to the invention, it is possible to provide a semiconductor device which can reduce on resistance and improve the reliability of a breakdown voltage and breakdown resistance, without adding a new manufacturing process, and can be manufactured at a low cost without an increase in costs and a method of manufacturing the same.

DETAILED DESCRIPTION

Hereinafter, a semiconductor device and a method of manufacturing the same according to embodiments of the invention will be described in detail with reference to the accompanying drawings. The invention is not limited to the following embodiments as long as it does not depart from the spirit and scope thereof. In addition, in the specification, a "breakdown voltage" means a voltage when an avalanche current starts to flow due to avalanche breakdown when a high voltage is applied to an element in an off state, that is, an avalanche breakdown voltage.

(First Embodiment)

Figure 1:
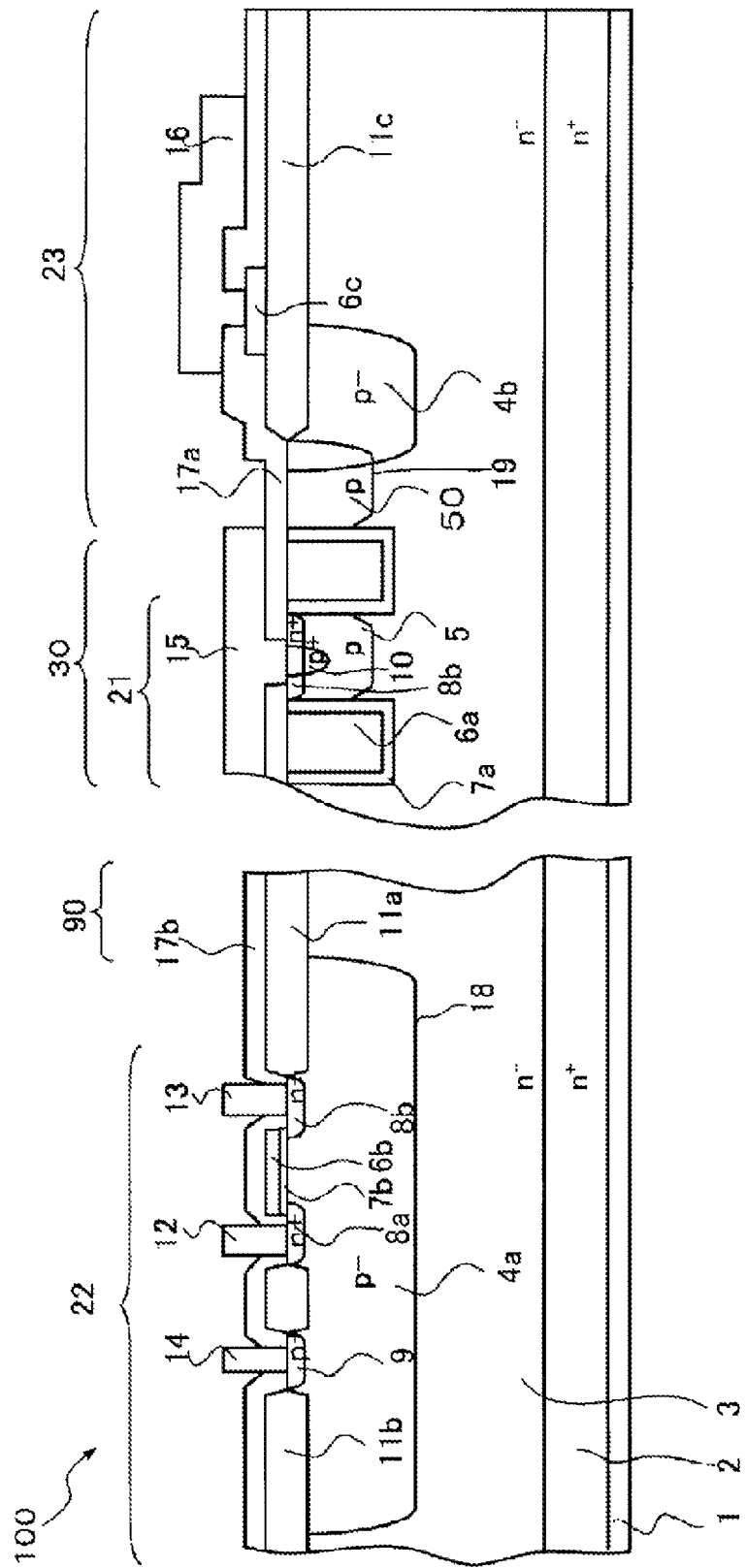
FIG. 1 is a cross-sectional view illustrating a main portion of a vertical trench gate-type power IC according to a first embodiment of a semiconductor device of the invention.

FIG. 1 is a cross-sectional view illustrating a main portion of a vertical trench gate-type power IC according to a first embodiment of a semiconductor device of the invention. FIG. 1 is a cross-sectional view illustrating a main portion of a vertical trench gate-type power IC 100 as a first embodiment of a complex semiconductor device according to the invention.

In the first embodiment, the vertical trench gate-type power IC 100 includes a vertical trench gate MOSFET element portion 30 which has a breakdown voltage of 50 V to 100 V and serves as an output-stage semiconductor element, a lateral n-channel MOSFET element portion 22 which has a breakdown voltage of about 10 V and serves as a control semiconductor element, and a junction edge termination region 23 which surrounds the element portions. The breakdown voltage of a well junction 18, which is a pn junction of a $p^-$ well diffusion region including the control semiconductor element and an $n^-$ epitaxial layer 3, and the breakdown voltage of the junction edge termination region 23 are equal to or greater than 100 V.

The vertical trench gate MOSFET element portion 30 and the planar-gate-type lateral n-channel MOSFET element portion (lateral n-channel MOSFET element portion for control) 22 for control are formed on a semiconductor substrate including an $n^+$ substrate 2 and the $n^-$ epitaxial layer 3. The lateral n-channel MOSFET element portion 22 and the vertical trench gate MOSFET element portion 30 share the $n^+$ substrate 2 and a semiconductor substrate, which is the $n^-$ epitaxial layer 3 provided on the $n^+$ substrate 2, and are adjacent to each other with an element isolation region 90 interposed therebetween.

The vertical trench gate MOSFET element portion 30 and the lateral n-channel MOSFET element portion 22 for control are arranged in parallel to each other on the semiconductor substrate, with a LOCOS oxide layer 11a (FIG. 1) serving as the element isolation region 90 interposed between. In addition, the $n^+$ substrate 2 is an n-type drain region (main drain region) in the vertical trench gate MOSFET element portion 30.

In order to solve the problem of the invention, first, when an off voltage is applied to cause breakdown (an avalanche current flows), it is necessary to prevent the concentration of a current on the junction edge termination region 23 and thus prevent element breakdown. In order to meet the requirements, the breakdown voltage of the well junction 18 of the lateral n-channel MOSFET element portion 22 for control and the junction edge termination region 23 needs to be higher than that of a main junction 19 (a pn junction of a p-type base region 5 and the $n^-$ epitaxial layer 3) in an active region 21 of the vertical trench gate MOSFET element portion 30. The structure therefore will be described below.

Figure 6:
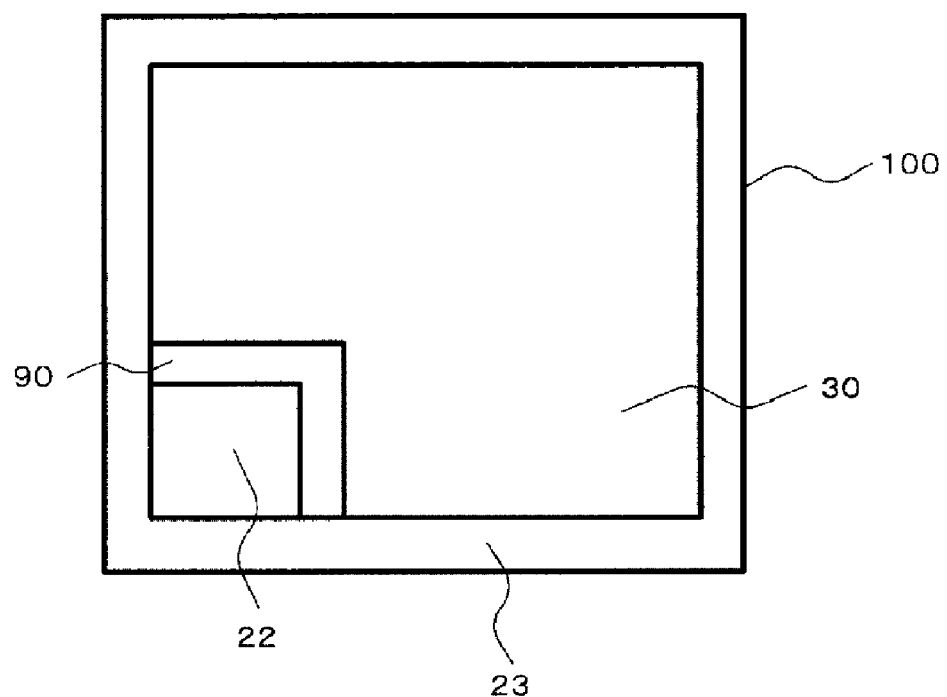
FIG. 6 is a plan view illustrating a vertical trench gate-type power IC according to the first embodiment of the semiconductor device of the invention.

FIG. 6 is a plan view illustrating the vertical trench gate-type power IC according to the first embodiment of the semiconductor device of the invention. In FIG. 6, the junction edge termination region 23 is arranged so as to surround the vertical trench gate MOSFET element portion 30 and the lateral n-channel MOSFET element portion 22 for control. The vertical trench gate MOSFET element portion 30 is arranged at the center of the chip and includes the active region 21 which is a main current path.

The active region 21 includes a trench gate structure in which a gate electrode 6a made of polysilicon is filled in a trench with a gate oxide layer 7a interposed between and a p-type base region 5 which comes into contact with the trench gate structure. In addition, the active region 21 includes an n+ source region 8b (main source region) which is formed on a surface layer of the p-type base region 5 and comes into contact with the p-type base region 5 and the inner wall of the trench and a p+ contact region 10 with high impurity concentration. A source electrode 15 comes into contact with the surfaces of the n+ source region 8b and the p+ contact region 10. The source electrode 15 is a source terminal. In addition, the n+ substrate 2 is an n-type drain region of the MOSFET. A drain electrode 1 formed on the rear surface of the n+ substrate 2 is a drain terminal. An interlayer dielectric 17a is provided between the source electrode 15 and the gate electrode 6a made of polysilicon.

The lateral n-channel MOSFET element portion 22 for control includes a p well diffusion region 4a, and an n+ drain region 8a (control drain region), an n+ source region 8b (control source region), and a p+ contact region 9 which are formed on a surface layer of the p-type well diffusion region 4a. A metal film is a drain electrode 12 or a source electrode 13. A base electrode 14 serves as a back gate electrode and is connected to the p+ contact region 9. A gate electrode 6b made of polysilicon is formed on the upper surface of a gate oxide layer 7b. The gate electrode 6b is a gate terminal.

The LOCOS oxide layer 11a and an interlayer dielectric 17b which comes into contact with the upper surface of the LOCOS oxide layer 11a are formed between the vertical trench gate MOSFET element portion 30 and the lateral n-channel MOSFET element portion 22 for control. The LOCOS oxide layer 11a and the interlayer dielectric 17b serve as the element isolation region 90. In addition, the LOCOS oxide layer 11b is formed between the lateral MOSFET and another lateral MOSFET (not illustrated) forming a control circuit and also serves as an element isolation region between circuit elements.

The junction edge termination region 23 has a junction termination structure for improving the breakdown voltage and maintaining the reliability of the breakdown voltage. In the junction edge termination region 23, a p-type sustain region 50 is formed so as to come into contact with the trench at the outer circumferential end of the chip of the vertical trench gate MOSFET element portion 30 and a p⁻ diffusion region 4b with low impurity concentration is formed so as to be continuous with the p-type sustain region 50. The p-type sustain region 50 is a diffusion layer which is formed by the same process as the p-type base region 5 and may be formed without any additional process.

In addition, a metal film field plate 16 and a polysilicon film field plate 6c are formed on the LOCOS oxide layer 11c which is formed on the surface of the p⁻ diffusion region 4b and the n⁻ epitaxial layer 3. The p⁻ diffusion region 4b is a diffusion layer which is formed by the same process as the p⁻ well diffusion region 4a of the lateral n-channel MOSFET element portion 22 for control and may be formed without any additional process.

The p⁻ diffusion region 4b is formed in a ring shape along the inside of the junction edge termination region 23. In addition, the p⁻ diffusion region 4b is formed at a concentration less than that of the p-type base region 5 or the p-type sustain region 50 and with a diffusion depth greater than that of the p-type base region 5 or the p-type sustain region 50. The p-type sustain region 50 is electrically connected to the p-type base region 5 at an arbitrary position of the element. Since the p⁻ diffusion region 4b is formed so as to be continuous with the p-type sustain region 50 as described above, it is electrically connected to the p-type sustain region 50.

For example, the p-type base region 5 and the p-type sustain region 50 have a diffusion depth of 1.5 μm to 2.5 μm and a surface impurity concentration of $5\times10^{16}$ cm$^{-3}$ to $9\times10^{16}$ cm$^{-3}$. Since the p⁻ well diffusion region 4a and the p⁻ diffusion region 4b are formed at the same time, they have a diffusion depth of 2 μm to 5 μm and a surface impurity concentration of $1\times10^{16}$ cm$^{-3}$ to $5\times10^{16}$ cm$^{-3}$.

As such, the p⁻ diffusion region 4b has a diffusion depth greater than that of the p-type base region 5 or the p-type sustain region 50 and an impurity concentration lower than that of the p-type base region 5 or the p-type sustain region 50. Therefore, it is possible to increase the area of the depletion layer in the junction edge termination region 23, as compared to a case in which the p⁻ diffusion region 4b is not formed. As a result, it is possible to reduce the maximum field intensity when the depletion layer is extended.

In this way, the breakdown voltage determined by the pn junction between the n⁻ epitaxial layer 3, and the p⁻ well diffusion region 4a and the p⁻ diffusion region 4b can be higher than the breakdown voltage determined by the main junction 19 or the bottom of the trench gate in the active region 21 of the vertical trench gate MOSFET element portion 30.

In this way, the avalanche current flowing when a voltage corresponding to the breakdown voltage is applied in an off state flows to the main junction 19 of the active region 21, and it is possible to prevent the avalanche current from being concentrated on the junction edge termination region 23. As a result, it is possible to prevent the device destruction caused by avalanche breakdown of the power IC.

Figure 5:
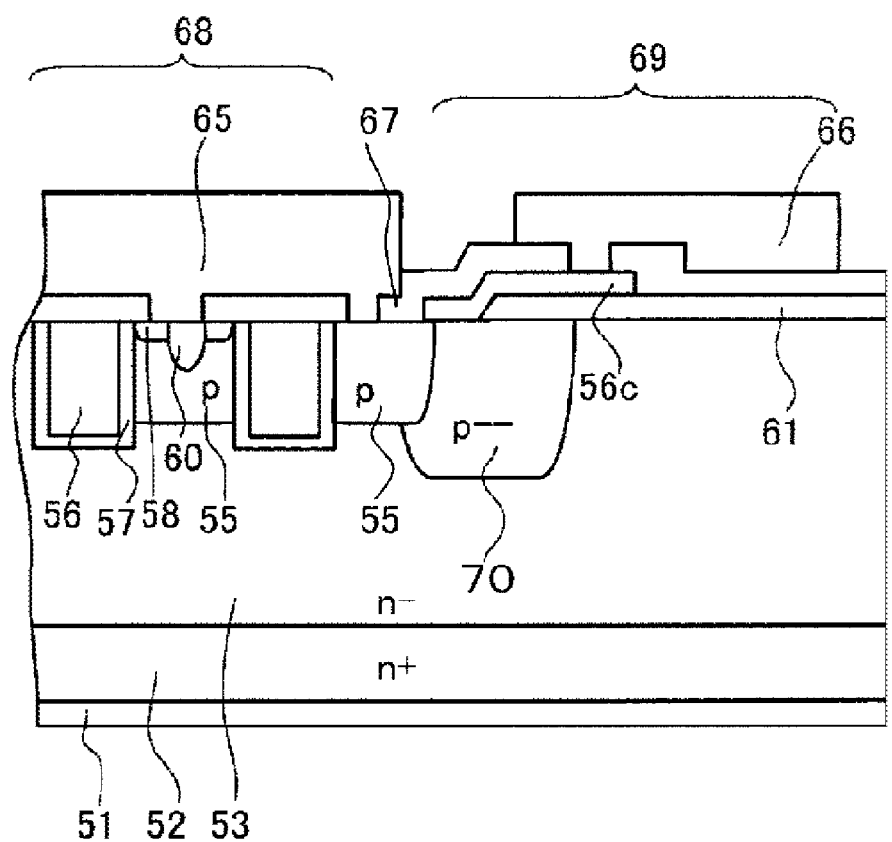
FIG. 5 is a cross-sectional view illustrating a main portion of a vertical trench gate MOS-type semiconductor element according to the related art and a junction edge termination region thereof.

As described above, since the impurity concentration of the p⁻ diffusion region 4b is the same as that of the p⁻ well diffusion region 4a, it is higher than the impurity concentration of the p⁻ RESURF region 70 (see FIG. 5) disclosed in the above-mentioned Patent Literature 2. In addition, the impurity concentration of the p⁻ diffusion region 4b needs to be lower than that of the p-type base region 5 which is equal to impurity concentration forming a general guard ring. This is because it is difficult to obtain a threshold voltage or an on current required for the lateral n-channel MOSFET element portion 22 for control at low impurity concentration where the impurity concentration of the surface of the p⁻ diffusion region 4b becomes the RESURF region or at the concentration of the p-type base region 5 of the vertical trench gate MOSFET.

Another characteristic of the invention is that the p-type sustain region 50 is provided so as to come into contact with the trench at the outer circumferential end of the vertical trench gate MOSFET element portion 30 and be continuous with the p⁻ diffusion region 4b. The p-type sustain region 50 is electrically connected to the p-type base region 5. As described above, since the p⁻ diffusion region 4b is formed by the same process as the p⁻ well diffusion region 4a, the impurity concentration of the p⁻ diffusion region 4b is higher than that of the RESURF region, but needs to be lower than impurity concentration forming the general guard ring.

Therefore, when strong charge with a concentration of about $1 \times 10^{12}/cm^2$ per unit area comes from the outside of the element, charge is likely to be induced at the interface between the interlayer dielectric 17a and the semiconductor substrate in a region between the trench at the end and the LOCOS oxide layer 11c. In some cases, the distribution of the equipotential line of the depletion layer which is extended when an off voltage is applied is changed by the induced charge and the breakdown voltage is reduced.

As described above, when the p-type sustain region 50 is formed so as to be electrically connected to the p-type base region 5, the equipotential line is distributed in the p⁻ diffusion region 4b through the p-type sustain region 50. Therefore, even when external charge comes into the surface of the interlayer dielectric 17a which comes into contact with the upper part of the p-type sustain region 50, charge is less likely to be induced at the interface between the interlayer dielectric 17a and the semiconductor substrate and a change in the distribution of the equipotential line can be reduced to the minimum. As a result, the reliability of the breakdown voltage is improved.

(Second Embodiment)

Figure 8:
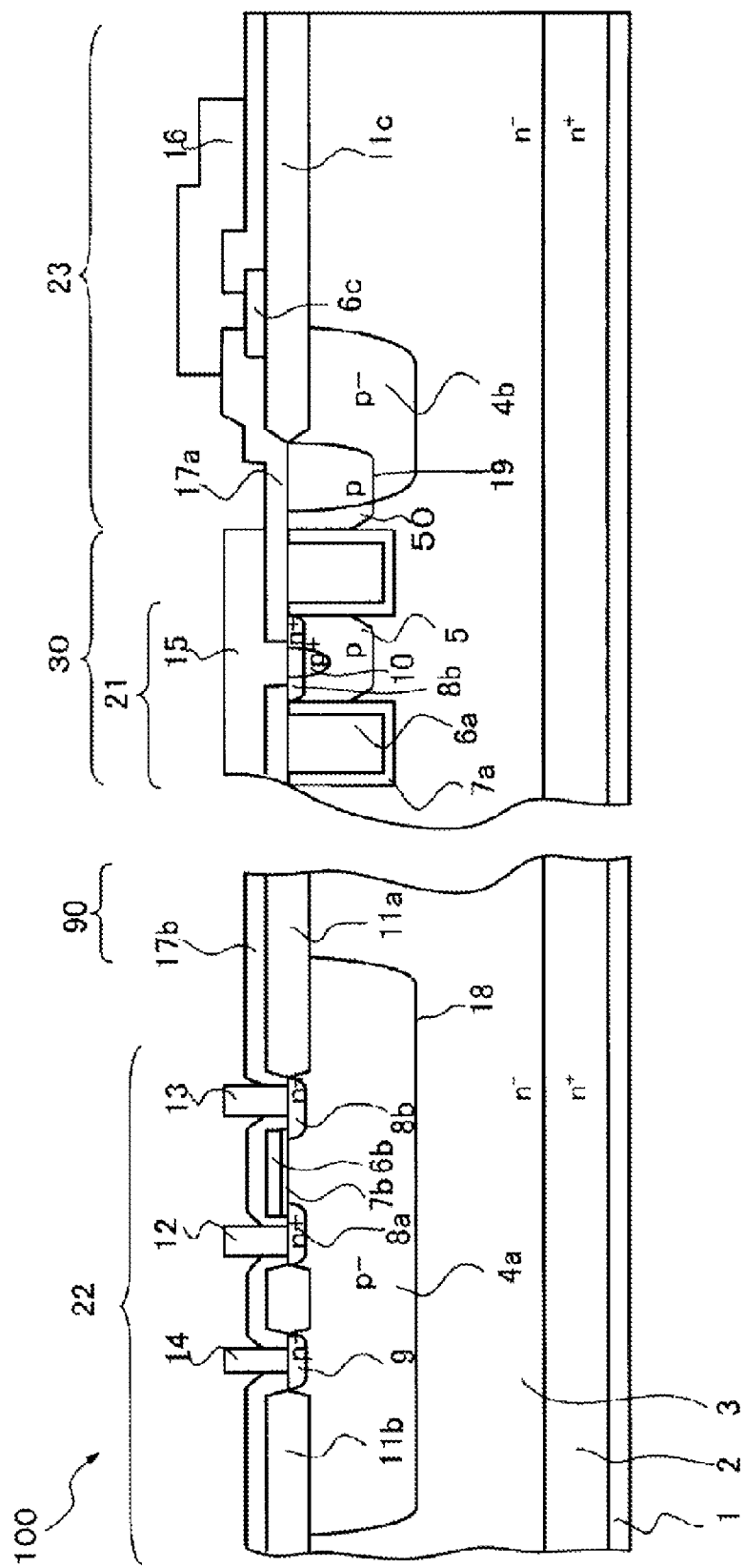
FIG. 8 is a cross-sectional view illustrating a main portion of a modification of a vertical trench gate-type power IC according to a second embodiment of the semiconductor device of the invention.

FIG. 8 is a cross-sectional view illustrating a main portion of a modification of a vertical trench gate-type power IC according to a second embodiment of the semiconductor device of the invention. The second embodiment is a modification of the first embodiment and differs from the first embodiment in that an overlap region between the p-type sustain region 50 and the p⁻ diffusion region 4b is extended in order to reduce the influence of external charge on the breakdown voltage, as illustrated in FIG. 8.

Specifically, a mask is placed such that a boron ion injection region when the p-type sustain region 50 is formed overlaps a boron ion injection region when the p⁻ diffusion region 4b is formed and boron ions are injected into each region. In this way, it is possible to further increase the surface concentration of the p-type region in the section from the trench provided at the end of the active region to the LOCOS oxide layer 11c. As a result, it is possible to reduce the influence of external charge on the breakdown voltage.

(Third Embodiment)

Figure 9:
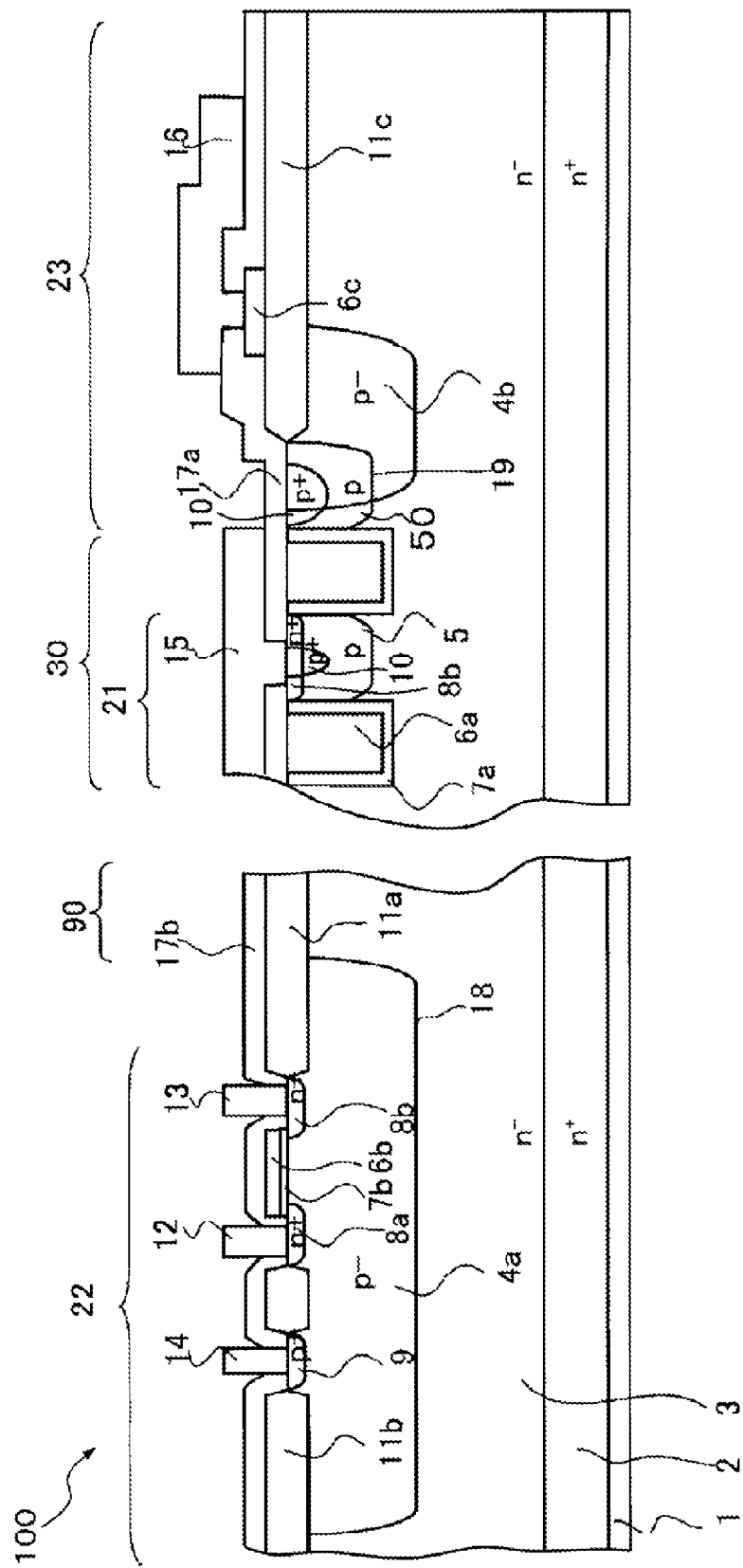
FIG. 9 is a cross-sectional view illustrating a main portion of a modification of a vertical trench gate-type power IC according to a third embodiment of the semiconductor device of the invention.

FIG. 9 is a cross-sectional view illustrating a main portion of a modification of a vertical trench gate-type power IC according to a third embodiment of the semiconductor device of the invention. The third embodiment is a modification of the second embodiment and differs from the second embodiment in that a p⁺ contact region 10 is additionally formed on the surface of the p-type sustain region 50 in order to reduce the influence of external charge on the breakdown voltage, as illustrated in FIG. 9. According to this structure, it is possible to further increase the surface concentration of the p-type region in the section from the trench provided at the end of the active region to the LOCOS oxide layer 11c. Therefore, it is possible to reduce the influence of external charge on the breakdown voltage.

(Fourth Embodiment)

Figure 2:
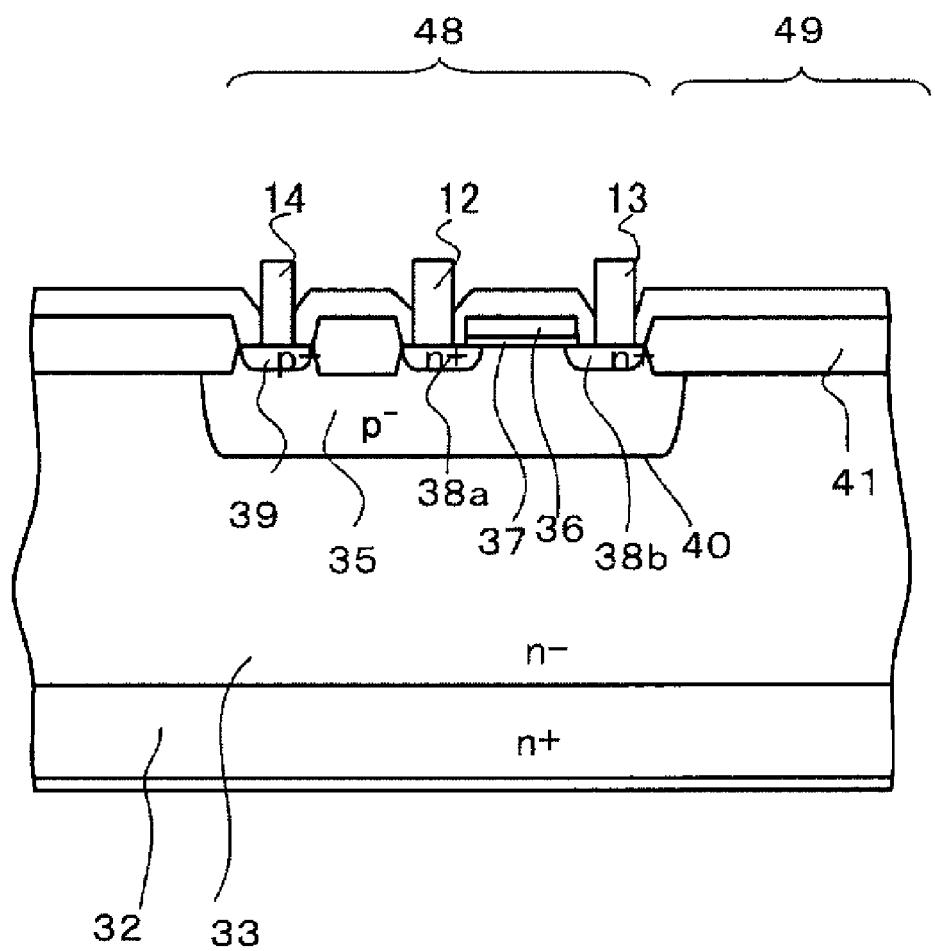
FIG. 2 is a cross-sectional view illustrating a general lateral planar MOS-type semiconductor element for control.
Figure 3:
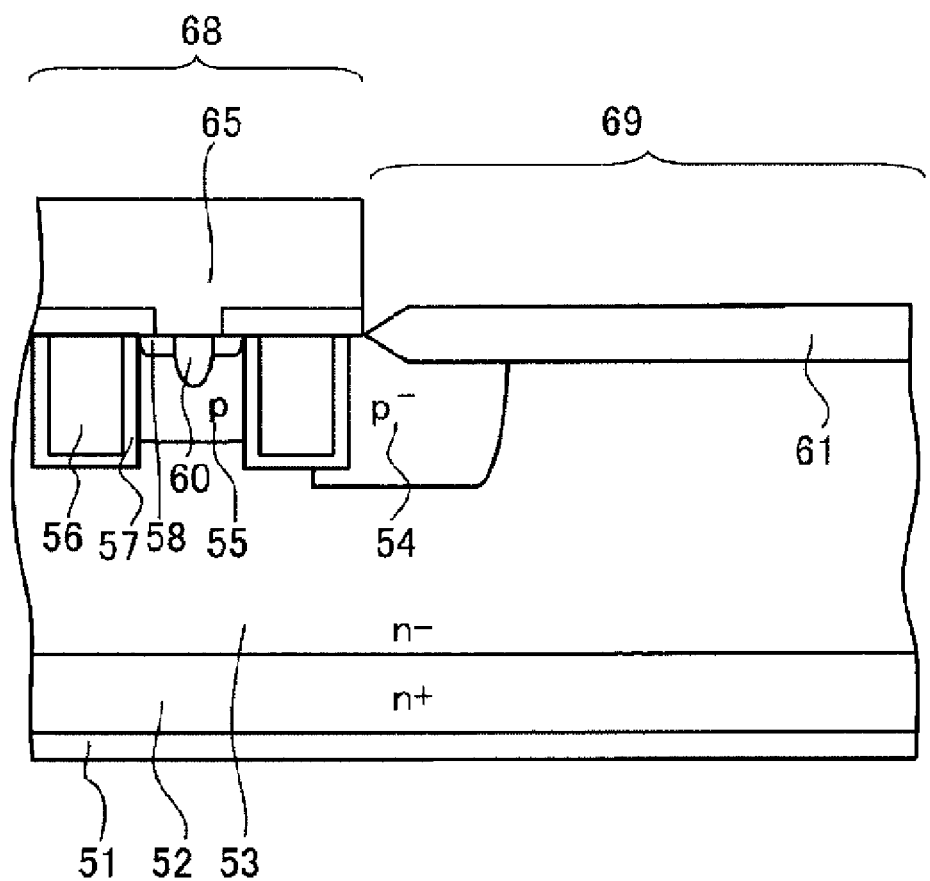
FIG. 3 is a cross-sectional view illustrating a main portion of a general vertical trench gate MOS-type semiconductor element and a junction edge termination region thereof.
Figure 7:
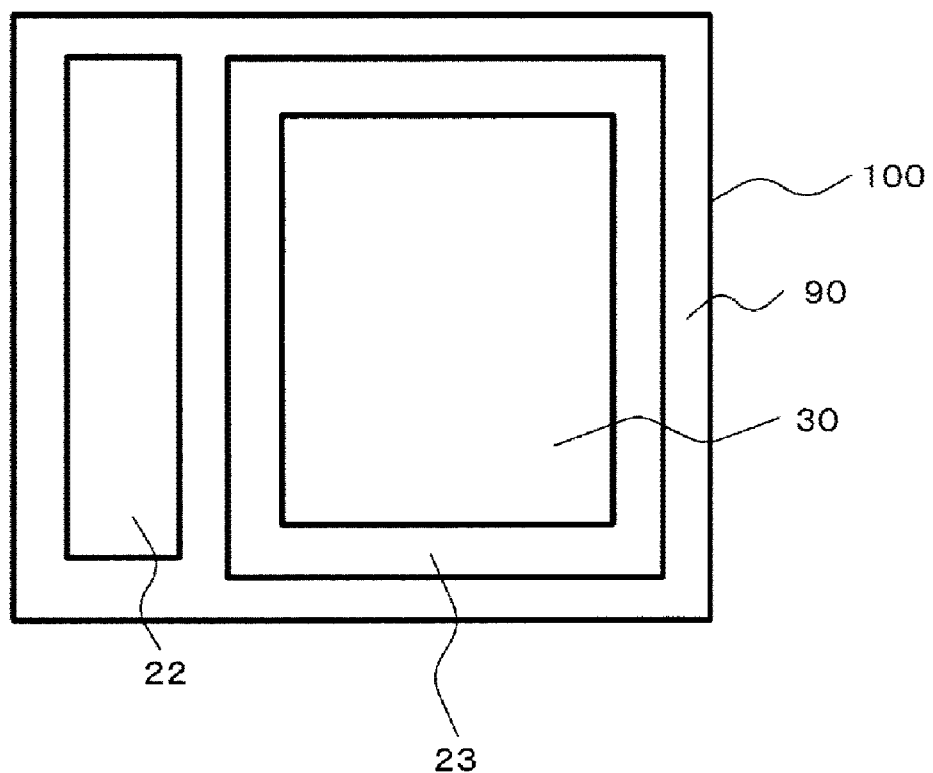
FIG. 7 is a plan view illustrating a modification of a vertical trench gate-type power IC according to a fourth embodiment of the semiconductor device of the invention.

FIG. 7 is a plan view illustrating a modification of a vertical trench gate-type power IC according to a fourth embodiment of the semiconductor device of the invention. In the vertical trench gate-type power IC according to the fourth embodiment of the semiconductor device of the invention, a junction edge termination region 23 is formed so as to surround a vertical trench gate MOSFET element portion 30 and is arranged on a semiconductor substrate in parallel to a lateral n-channel MOSFET element portion 22 for control, with a LOCOS oxide layer 11a serving as an element isolation region 90 interposed therebetween. The fourth embodiment differs from the first embodiment in that the junction edge termination region 23 is provided so as to surround only the vertical trench gate MOSFET element portion 30. When the lateral n-channel MOSFET element portion 22 for control can have a sufficiently high breakdown voltage in the junction edge termination region 49 according to the related art illustrated in FIG. 2, it is possible to reduce the field intensity of only the vertical trench gate MOSFET element portion 30 in the junction edge termination region 23.

(Fifth Embodiment)

Figure 4:
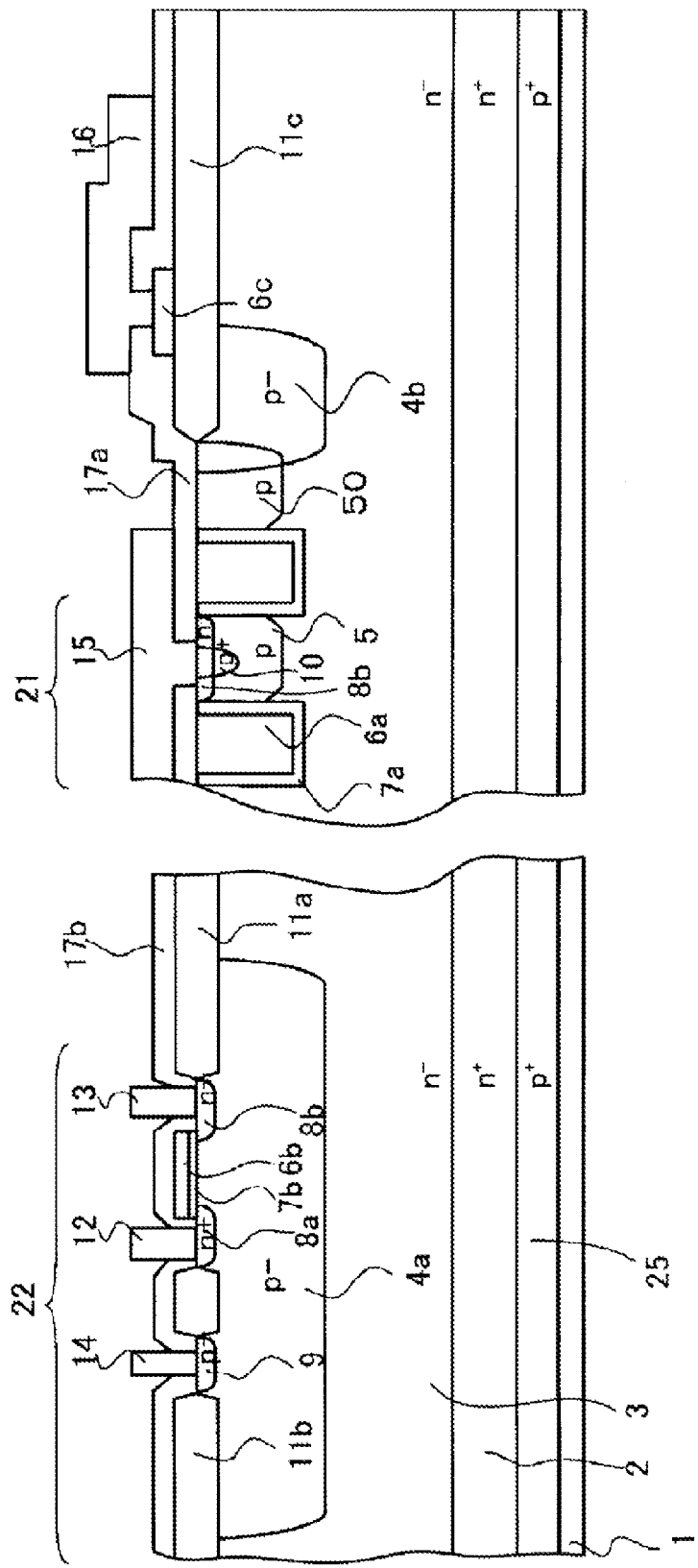
FIG. 4 is a cross-sectional view illustrating a main portion of another semiconductor device according to a fifth embodiment of the semiconductor device of the invention.

FIG. 4 illustrates a fifth embodiment of the invention. FIG. 4 illustrates a structure in which a p⁺ semiconductor layer 25 (p⁺ collector layer) is additionally formed on the rear surface of an n⁺ substrate 2 of a vertical trench gate MOSFET element portion 30, which is the output-stage semiconductor element illustrated in FIG. 1, to obtain a vertical trench gate IGBT (insulated gate bipolar transistor) as the output-stage semiconductor element.

An IGBT may be used as the output-stage element in order to reduce on resistance and increase the breakdown voltage, as compared to the MOSFET, in the active region of the output-stage semiconductor element in which the main current flows. The IGBT has an on resistance (on voltage) lower than that of the MOSFET at a rated voltage of about 300 V or more. However, as the breakdown voltage of the output-stage element increases, the specific resistance of the n⁻ epitaxial layer 3 increases. Therefore, the equipotential line which is extended to the junction edge termination region 23 in an off state is likely to be affected by external charge. Therefore, the p-type sustain region 50 makes it possible to further reduce the influence of external charge and increase the reliability of the breakdown voltage.

In the above-described embodiments of the invention, the first conduction type is an n type and the second conduction type is a p type. However, the invention is not limited to the embodiments in which the first conduction type is an n type and the second conduction type is a p type. In the embodiments of the invention, the n type and the p type may be exchanged such that the first conduction type is the p type and the second conduction type is the n type. In this case, some components can operate in the same manner as described above. In the above-described embodiments of the invention, a symbol +(−) described on the right side of each region (a p region and an n region) in the drawings means that the impurity concentration of the region is higher (lower) than that of other regions.

INDUSTRIAL APPLICABILITY

As described above, the semiconductor device and the semiconductor device manufacturing method according to the invention are useful for a complex semiconductor device, such as a trench gate-type power IC which has a high breakdown voltage, in which a vertical trench MOS gate-type semiconductor element and a protective or control semiconductor element are formed on the same semiconductor substrate, and a method of manufacturing the same. In particular, the semiconductor device and the semiconductor device manufacturing method according to the invention are suitable for a MOS-type semiconductor device, such as an IGBT which can reduce on resistance, and improve the reliability of the breakdown voltage and breakdown resistance, without adding a new manufacturing process, and can be manufactured at a low cost without an increase costs, and a method of manufacturing the same.

REFERENCE SIGNS LIST 1, 12, 51 DRAIN ELECTRODE
2, 32, 52 n⁺ SUBSTRATE
3, 33, 53 n⁻ EPITAXIAL LAYER
4a, 34 p⁻ WELL DIFFUSION REGION
4b, 54 p⁻ DIFFUSION REGION
5, 35, 55 p-TYPE BASE REGION
50 p-TYPE SUSTAIN REGION
6a, 6b, 36, 56 GATE ELECTRODE
7a, 7b, 37, 57 GATE OXIDE LAYER
8b, 38b, 58 n⁺ SOURCE REGION
8a, 38a n⁺ DRAIN REGION
39 BASE CONTACT REGION
9, 10, 60 p⁺ CONTACT REGION
11a, 11b, 11c LOCOS OXIDE LAYER
41, 61 LOCOS OXIDE LAYER
13, 15, 65 SOURCE ELECTRODE
14 BASE ELECTRODE
16, 66 METAL FILM FIELD PLATE
6c POLYSILICON FILM FIELD PLATE
17a, 17b INTERLAYER DIELECTRIC
30 VERTICAL TRENCH GATE MOSFET ELEMENT PORTION
21, 48, 68 ACTIVE REGION
22 LATERAL n-CHANNEL MOSFET ELEMENT PORTION FOR CONTROL
23, 49, 69 TERMINATION BREAKDOWN VOLTAGE REGION
25 p⁺ SEMICONDUCTOR LAYER
18, 40 WELL JUNCTION
19 MAIN JUNCTION
70 p⁻ RESURF REGION
90 ELEMENT ISOLATION REGION
100 VERTICAL TRENCH GATE-TYPE POWER IC

The invention claimed is:

1. A method of manufacturing a semiconductor device, comprising:
providing a main drain region which is a first conduction type and is formed on a first main surface of a semiconductor substrate of the first conduction type;
providing a vertical trench MOS gate-type semiconductor element portion including a base region that is a second conduction type and is selectively formed on a second main surface of the semiconductor substrate, a main source region that is the first conduction type and is selectively formed on a surface of the base region, a trench that extends from a surface of the base region to the semiconductor substrate through the base region and the main source region, and a trench MOS gate that includes a gate electrode provided in the trench with a first insulating film, which is an insulating film, interposed therebetween;
providing a semiconductor element portion for control that is adjacent to the vertical trench MOS gate-type semiconductor element portion, with an element isolation region including a second insulating film which is formed on the second main surface of the semiconductor substrate and is thicker than the first insulating film interposed therebetween, includes a well diffusion region which is the second conduction type and forms a pn junction with the semiconductor substrate on the second main surface of the semiconductor substrate, a gate electrode for control which is formed on a surface of the well diffusion region with a third insulating film which is thinner than the second insulating film interposed therebetween, and a control drain region of the first conduction type and a control source region of the first conduction type which are provided on the surface of the well diffusion region with the control gate electrode interposed between, and controls the vertical trench MOS gate-type semiconductor element portion;
providing a junction edge termination region that includes the second insulating film provided on the second main surface of the semiconductor substrate and surrounds the vertical trench MOS gate-type semiconductor element portion or both the vertical trench MOS gate-type semiconductor element portion and the semiconductor element portion for control,
wherein the junction edge termination region includes the second insulating film, a sustain region which is the second conduction type and comes into contact with the trench at an outer circumferential end of the vertical trench MOS gate-type semiconductor element portion, and a first region which is the second conduction type and is provided so as to come into contact with an outside of the sustain region,
the first region has a junction depth greater than that of the base region and has low impurity concentration,
the sustain region has a junction depth less than that of the first region and has high impurity concentration,
the well diffusion region has a junction depth greater than those of the base region and the sustain region and has low impurity concentration, and
an avalanche breakdown voltage of the junction edge termination region and the well diffusion region is higher than that of the vertical trench MOS gate-type semiconductor element portion; and
forming the first region and the well diffusion region included in the semiconductor device at a same time.

2. The method of manufacturing the semiconductor device according to claim 1,
wherein the sustain region and the base region included in the semiconductor device are formed at a same time.

* * * * *